United States Patent [19]

Yamamoto et al.

[11] Patent Number: 5,047,798
[45] Date of Patent: Sep. 10, 1991

[54] THERMAL FIXING UNIT HAVING GAS PURIFICATION MEANS

[75] Inventors: Takemi Yamamoto; Osamu Takagi, both of Nagoya; Yumio Matsumoto, Kasugai; Yasuo Kimura, Ichinomiya; Takashi Nakata, Nagoya, all of Japan

[73] Assignee: Brother Kogyo Kabushiki Kaisha, Aichi, Japan

[21] Appl. No.: 449,818

[22] Filed: Dec. 13, 1989

[30] Foreign Application Priority Data

Dec. 16, 1988 [JP] Japan .................................. 63-318874
Dec. 19, 1988 [JP] Japan .................................. 63-321337
Jan. 30, 1989 [JP] Japan .................................... 1-20510
Jan. 31, 1989 [JP] Japan .................................... 1-23047

[51] Int. Cl.⁵ .............................................. G03B 27/52
[52] U.S. Cl. ........................................ 355/27; 355/30; 219/216
[58] Field of Search ...................... 355/27, 28, 30, 32, 355/285, 286, 287, 288; 219/216

[56] References Cited

U.S. PATENT DOCUMENTS 4,202,618  5/1980  Waschk et al. ..................... 355/30
4,893,147  1/1990  Tanabe et al. ..................... 355/27

Primary Examiner—L. T. Hix
Assistant Examiner—Khanh Dang
Attorney, Agent, or Firm—Oliff & Berridge

[57] ABSTRACT

A thermal fixing unit provided with gas purification means for use in an image recording medium. The gas purification means traps gaseous component released from a developer sheet upon heating thereof. The purification means includes a duct body disposed to surround a main frame of the thermal fixing unit, a support body having one end connected to the duct body, a fluid passage being defined between the main frame and the duct body, and the fluid passage being connected between the one end of the support body and sheet inlet and sheet outlet of the thermal fixing unit, the gas venting fan rotatably provided at the support body for sucking fluid in the main frame through the sheet inlet, the sheet outlet and the fluid passage, and a filter member disposed in the support body for trapping the gaseous component released from the developer sheet.

15 Claims, 6 Drawing Sheets

THERMAL FIXING UNIT HAVING GAS PURIFICATION MEANS

BACKGROUND OF THE INVENTION

The present invention relates to a thermal fixing unit for fixing an image provided on a sheet, and more particularly, the invention relates to the thermal fixing unit for use in a copying machine in which a latent image formed on a photosensitive pressure sensitive sheet is visualized in a developer sheet medium.

In a copying machine, a photosensitive pressure sensitive recording medium carrying thereon a latent image is superposed with a developer sheet medium, and these mediums are pressed together for providing a chromogenic reaction upon rupture of microcapsules on the photosensitive medium. By the chromogenic reaction, a visible image is formed on the developer sheet medium which is then heated by a heat roller etc. for fixing the output image during travel of the developer medium.

In such conventional heating unit, gaseous substance may be released from the developer sheet upon heating, and the gas is discharged out of the heating unit. Such gas has an uncomfortable smell.

A copending U.S. patent application, commonly assigned has been filed bearing Ser. No. 385,376 filed on July 27, 1989. In the copending application, disclosed is a thermal fixing unit in which hot air is blown onto the developer sheet after it is developed. In this thermal fixing unit, also, gas generated may be flowed out of the fixing unit.

SUMMARY OF THE INVENTION

It is therefore, a primary object of the present invention to remove the above-described gaseous component released from a heated developer sheet for providing a clean ambient condition around a thermal fixing unit.

Another object of the invention is to reduce power consumption which power is required for initial start up period of the thermal fixing unit, and for mode changing phase for changing temperature mode within the thermal fixing unit.

Still another object of the invention is to provide a detection means in the gas purification means in order to detect service life of a filter used therein.

Still another object of the invention is to provide means for detecting existence of the filter and alarming means which notifies an operator of non-existence of the filter in the gas purification means.

The primary object of the invention will be attained by providing a thermal fixing unit for thermally fixing an output image recorded on an image recording medium, the image recording medium including a developer sheet comprising a base substrate and a developer material coated therefore, the output image being formed by a chromogenic reaction between the developer material and a chromogenic material selectively formed on a separate photosensitive sheet, the thermal fixing unit comprising: a main frame provided with a sheet inlet and sheet outlet and defining a sheet path therebetween, a transferring means disposed within the main frame for transferring the developer sheet along the sheet path, a heating means disposed within the main frame for heating the developer sheet transferred along the sheet path, the developer sheet releasing gaseous component upon heating, and gas purification means connected to the main frame for removing the gaseous component.

DETAILED DESCRIPTION OF THE PREFERRED EMBODIMENTS

Figure 1:
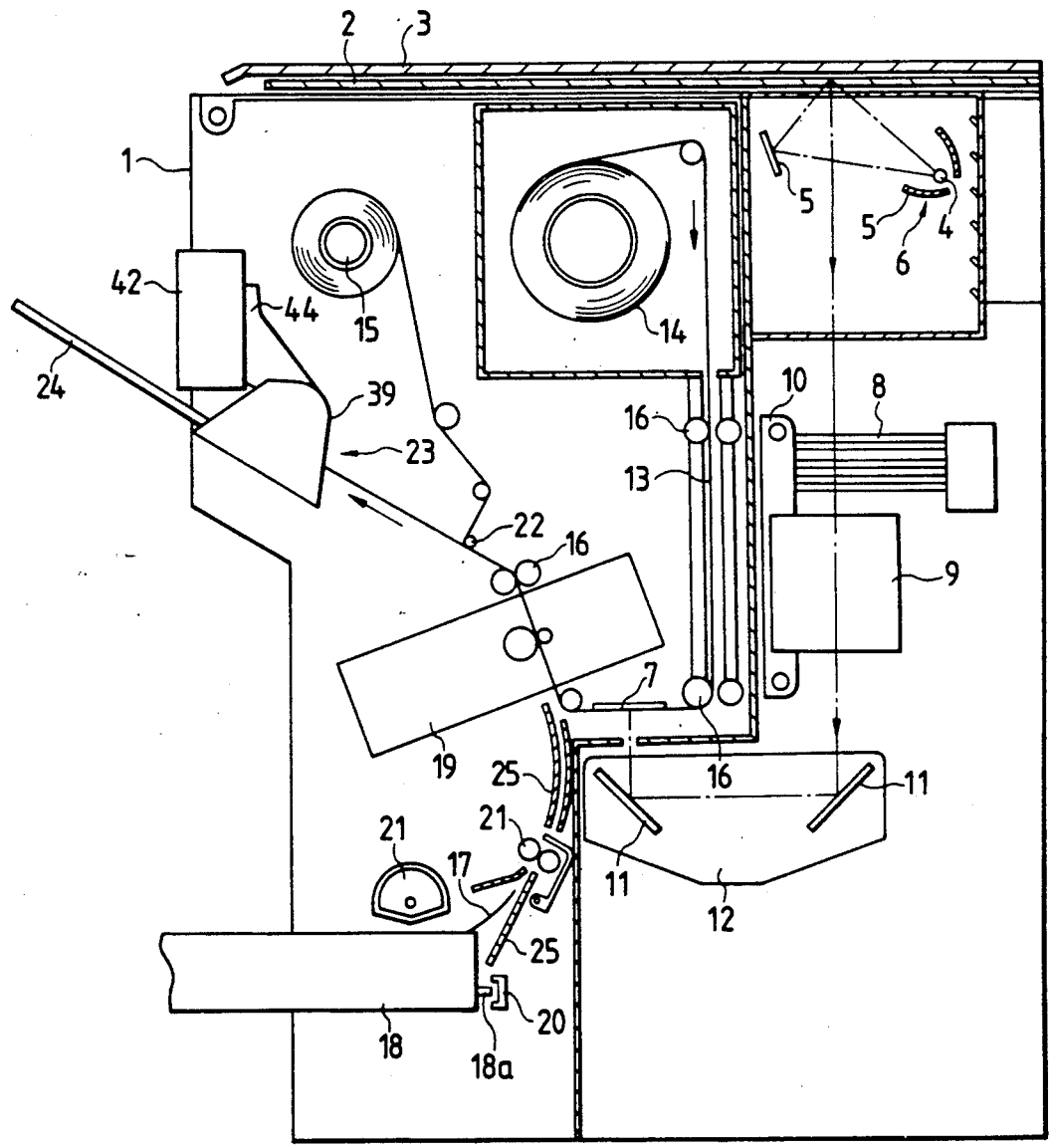
FIG. 1 is a schematic side elevation showing an image recording apparatus in the present invention.

A color copying machine which embodies the present invention will first be described with reference to FIG. 1. As shown, a machine frame 1 has an upper portion provided with an original support glass plate 2 for mounting thereon an original, and a cover 3 for opening and closing the original support glass plate 2. The glass plate 2 and the cover 3 are movable in a horizontal direction. A light source 6 including a halogen lamp 4 and a reflector 5 is provided below the original support glass plate 2. The halogen lamp 4 is adapted for irradiating light to the original on the glass plate 2 and extends in a direction perpendicular to the moving direction of the original support glass plate 2. The reflector 5 is adapted to direct light from the halogen lamp 4 to the original support glass plate 2. During light irradiation from the light source 6, the original support glass plate 2 is moved in a horizontal direction so that the entire area of the original is subjected to light irradiation.

An exposure stand 7 is disposed at an internal central portion of the machine frame 1. Further, a filter 8 for a color tone control and a focusing lens unit 9 are positioned between the light source 6 and the exposure stand 7. The filter 8 and the lens unit 9 are supported by an attachment plate 10. A pair of reflection mirrors 11 are positioned between the lens unit 9 and the exposure stand 7 for adjusting a light path length and focal length. These reflection mirrors 11 are movably supported on an attachment member 12. A light from the light source 6 is reflected at the original and is directed toward the exposure stand 7 through the filter 8, the lens unit 9 and the reflection mirrors 11.

A sheet cartridge 14 is detachably provided at an upper internal space of the machine frame 1. Within the cartridge 14, an elongated web-like photosensitive sheet 13 is installed in a rolled state. Used as the photosensitive sheet is a microcapsule sheet in which a plurality of microcapsules are formed which encapsulate therein chromogenic material or dye precursor. Beside the sheet cartridge 14, there is provided a takeup shaft 15 which is rotatable for winding the microcapsule sheet 13 thereover. A plurality of feed rollers 16 are rotatably provided for guiding the travel of the microcapsule sheet 13. The microcapsule sheet 13 is drawn out of the sheet cartridge 14 and is wound over the takeup shaft 15 by means of feed rollers 16. During the travel of the sheet 13, it passes along a lower surface of the exposure stand 7 at which point the sheet 13 is exposed to light for forming a latent image thereon corresponding to an image of the original.

A sheet cassette 18 is detachably provided at a lower inner portion of the machine frame 1 and below the exposure stand 7. The cassette 18 is adapted for storing a stack of cut developer sheets 17 each having predetermined size. The developer sheet 17 may include a substrate formed of a transparent plastic film for use in an overhead projector.

A pressure developing unit 19 is disposed at a position between the exposure stand 7 and the takeup shaft 15. In the pressure developing unit 19, the light-exposed portion of the microcapsule sheet 13, superposed with one of the developer sheets 17, is pressed so that the non-light exposed microcapsules are ruptured to provide a chromogenic reaction with developer material formed on the developer sheet 17. As a result, a color output image is provided on the developer sheet 17. The sheet cassette 18 is provided with a protrusion 18a which identifies a size of the sheet to be accommodated in the cassette. A machine frame 1 is provided with a detecting means 20 which detects the protrusion 18a so as to determine the sheet size.

A sector roller 21 is positioned above the cassette 18 for feeding each one of the developer sheets 17. Further, a plurality of feed rollers 21 and a sheet guide 25 are provided between the sheet cassette 18 and the pressure developing unit 19 for transferring the developer sheet 17 from the cassette 18 to the developing unit 19.

At an exit side of the pressure developing unit 19, a separation roller 22 is provided for separating the developer sheet 17 from the microcapsule sheet 13. Further, a thermal fixing unit 23 is disposed at a position downstream of the pressure developing unit 19 for thermally fixing an output image provided on the developer sheet 17. Furthermore, a discharge tray 24 is provided at an extreme end portion of a developer sheet path for receiving the developer sheet 17 which has been subjected to thermal fixing treatment in the thermal fixing unit 23. The thermal fixing unit 23 includes a main body 39. Further, a hollow supporting frame 42 and a duct 44 are provided, those being described in detail with reference to FIG. 2.

Figure 2:
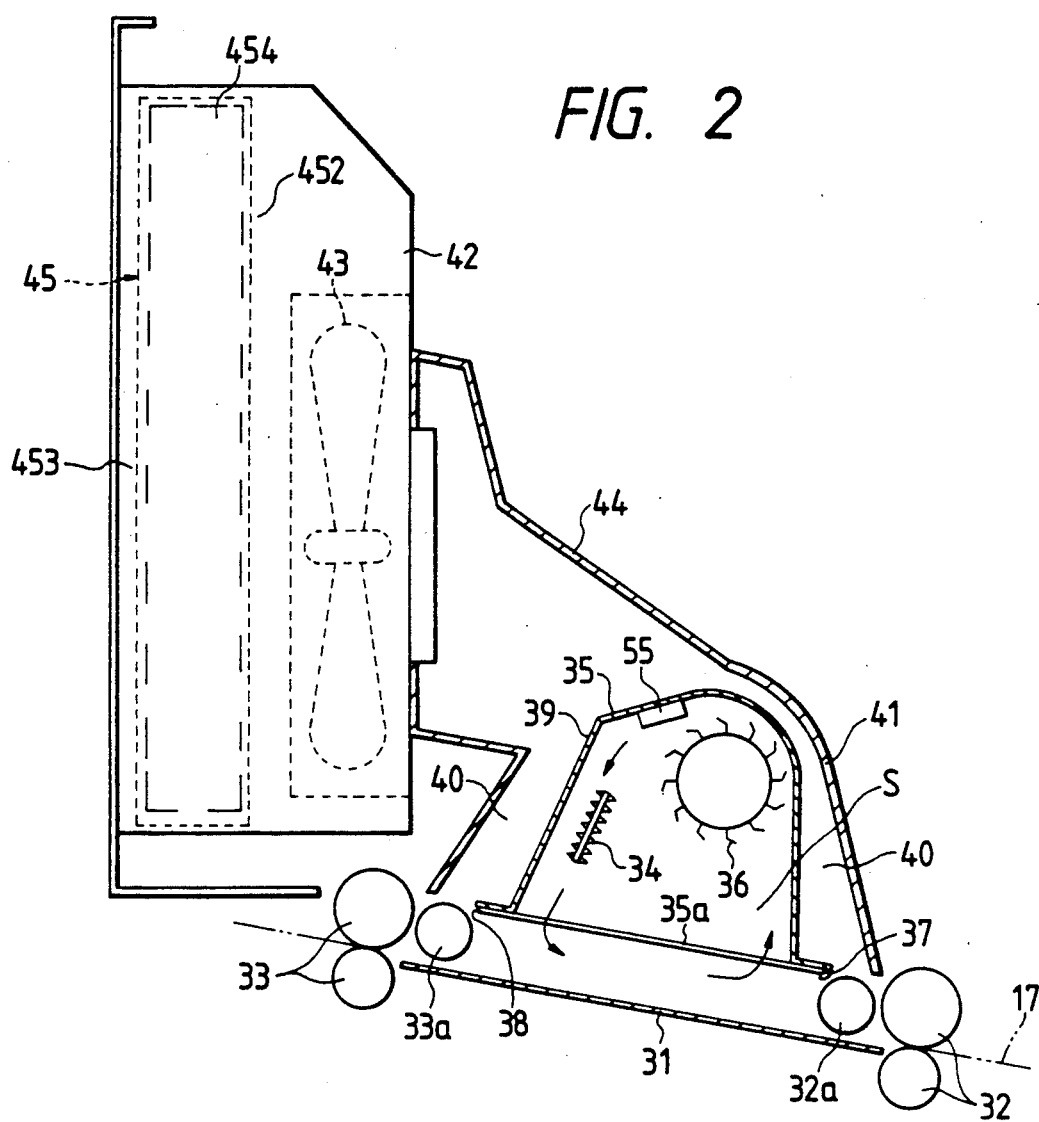
FIG. 2 is a cross-sectional view showing a thermal fixing unit provided with a gas purification means according to a first embodiment of this invention.

FIG. 2 shows a thermal fixing unit provided with a gas purification means according to a first embodiment of this invention. In FIG. 2, the thermal fixing unit 23 includes a guide plate 31 formed of iron which defines the developer sheet path. The guide plate 31 is provided with a sheet passing detection switch (not shown) which generates a signal indicative of the complete discharge of the developer sheet 17 out of a sheet outlet 38 described later. Further, feed-in rollers 32 and feed-out rollers 33 are rotatably provided at inlet and outlet sides of the guide plate 31, respectively. These rollers extend in a direction perpendicular to the running direction of the developer sheet 17. Upon rotation of these rollers, the developer sheet 17 is moved along the guide plate 31.

At a position above the guide plate 31, provided are a casing member 35 formed with a downwardly directed opening and a shielding plate 35a secured to the opening. The shielding plate 35a is of a metallic mesh form, and the plate 35a and the casing member 35 define an internal space S. Within the internal space S and at the position adjacent to the outlet side, a heater 34 is positioned which is in the form of a coil element made of Nichrome line. Upon electrical power supply to the heater, ambient air is heated by the heater 34, and the heated air can pass through the meshes of the shielding plate 35a.

Further, a fan 36 such as a cross-flow fan is positioned within the space and at the inlet side. The crossflow fan 36 has a rotation axis extending in a direction perpendicular to the sheet path. Upon actuation of the fan 36, air in the casing 35 and heated by the heater 34 is circulated as shown by the arrows in FIG. 2. Between the casing member 35 and the guide plate 31, a sheet inlet 37 and the sheet outlet 38 are defined at positions inwardly of the feed-in rollers 32 and the feed-out rollers 33. Further, heat insulation rollers 32a and 33a are rotatably provided. The roller 32a is adapted to close sheet inlet 37 and is positioned between the feed-in rollers 32 and the sheet inlet 37, and the roller 33a is adapted to close the sheet outlet 38 and is positioned between the feed-out rollers 33 and the sheet outlet 38. The casing member 35 and the guide plate 31 constitute in combination the main body 39 of the thermal fixing unit 23.

In the first embodiment, a cover member 41 is disposed over an entire area of the main body 39. The cover member 41 and the main body 39 define an air passage 40 therebetween which is also in fluid communication with the sheet inlet 37 and the sheet outlet 38. Further, at a position above the main body 39 and within the machine frame 1, the hollow supporting frame 42 is installed. Within the hollow supporting frame 42, a gas venting fan 43 is rotatably supported for sucking a gas released from the developer sheet 17 which gas is generated upon heating the sheet 17. A duct 44 is provided between the cover member 41 and an intake side of the gas venting fan 43, so that the fan 43 is in fluid communication with the interior of the thermal fixing unit through the air passage 40.

A filter 45 is disposed within the supporting frame 42 and at a position between the gas venting fan 43 and an exhaust port (not shown). The gas venting fan 43 and the filter 45 constitute in combination a gas sucking means or gas purification means.

Figure 3:
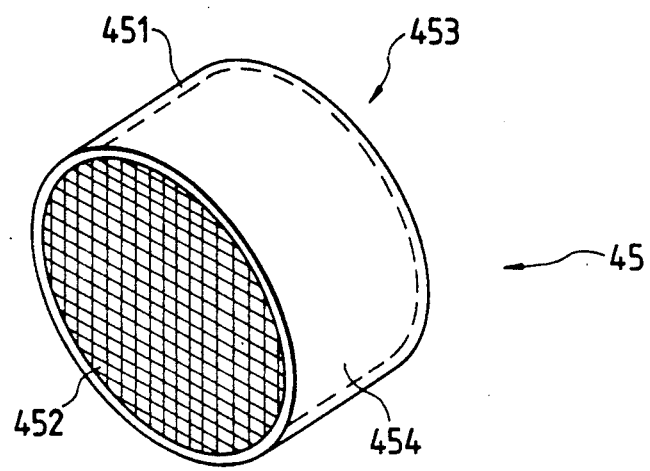
FIG. 3 is a perspective view showing a filter element employed in the first embodiment.

The filter member 45 is best shown in FIG. 3 which includes an outer cylindrical frame 451, metallic meshes 452 and 453 disposed at open ends of the outer cylindrical frame 451 and a deodorizing agent 454 accommodated between the metallic meshes 452 and 453. One of the metallic meshes 452 confronts the gas venting fan 43, whereas other mesh 453 is in fluid communication with an atmosphere. Further, a paper having high gas venting characteristic is provided on an inner surface of each of the metallic meshes and the deodorizer 454 is positioned between the papers. Even if the developer material is of the type which releases odor upon heating the developer sheet 17, the odor component is absorbed by the deodorizing agent 454.

The filter 45 contains activated charcoal. An outer peripheral surface of the filter 45 is provided with a sealing member (not shown) for sealingly securing the same to the supporting frame 42.

Figure 4:
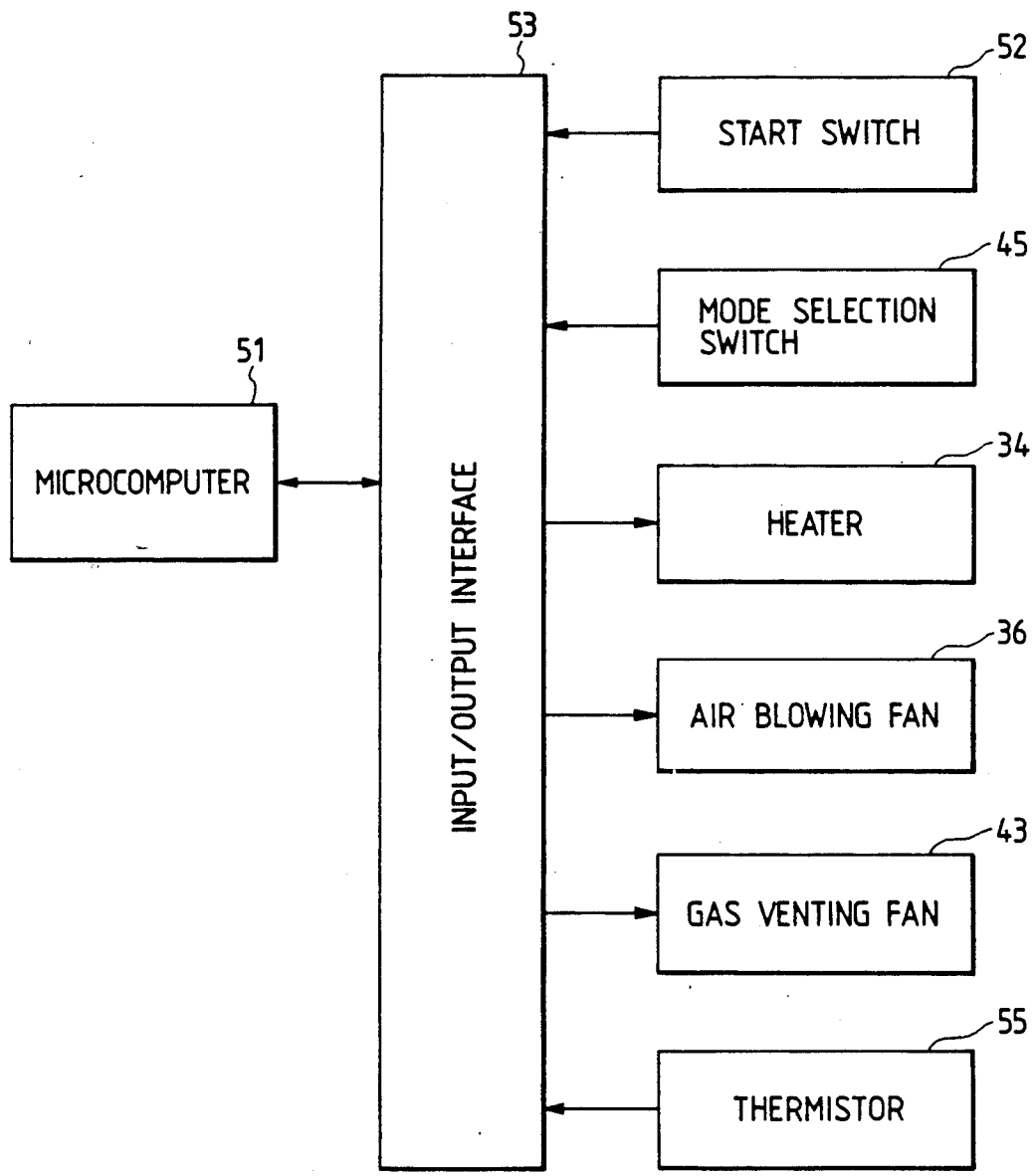
FIG. 4 is a block diagram showing a controlling portion in the first embodiment.

The copying machine which incorporates the first embodiment of this invention is provided with a microcomputer 51 as shown in FIG. 4. The microcomputer 51 is connected, through an input/output interface 53, to a start switch 52 which generates output signal indicative of the machine start. Further, the microcomputer 51 is connected, through the input/output interface 53, to a mode selection switch 45. Upon manipulation of the mode selection switch 45, selected is one heating mode among three kinds of heating modes which provide heating temperature different from one another. The three modes are low gloss mode providing a heating temperature of 135° C., high gloss mode providing a heating temperature of 145° C., and OHP (over head projector) mode providing a heating temperature of 160° C. One of the low gloss mode and the high gloss mode are selected so as to generate a difference in gloss degree in copying when using an ordinary developer sheet 17, whereas the OHP mode is selected when using the OHP sheet coated with the developer material.

As shown in FIG. 2, a thermistor 55 is provided at an internal surface of the casing member 35, and as shown in FIG. 4, the microcomputer 51 is connected, through the input/output interface 53, to the thermistor 55 which generates a signal indicative of the temperature in the main body 39, the signal being inputted into the microcomputer 51. Further, the heater 34, the air blowing fan 36 and the gas venting fan 43 are connected to the microcomputer 51 through the input/output interface 53.

With the construction thus organized, in case of the color copying, upon depression of a power switch, the microcomputer operates the heater 34 and the blower 36 in accordance with one specific mode selected by the mode selection switch 45, so that the temperature within the main body 39 is elevated. In response to the input signal from the thermistor 55 which is indicative of the temperature within the main body 39, the heater 34 is subjected to ON/OFF control by the microcomputer 51 so as to maintain a constant temperature within the main body 39 in accordance with the selected specific mode. Until the temperature within the main body 39 reaches the predetermined temperature, importantly, the gas venting fan 43 is maintained in a non-operative state by the microcomputer 51 to provide efficient temperature elevation within the main body 39, otherwise, the heated air is sucked by the gas venting fan 43 and prevents the temperature from being increased.

Next, upon manipulation of the start switch 52, the microcomputer 51 operates an original moving mechanism (not shown) so that the original support glass plate 2 is horizontally moved in one direction (rightwardly in FIG. 1). At the same time, the sector rollers 21 are operated for delivering one developer sheet 17 toward the inlet portion of the pressure developing unit 19. When the one edge (left edge in FIG. 1) of the original reaches a position confronting the linear halogen lamp 4 of the light source 6, the halogen lamp 4 is lighted by the microcomputer 51, and the original support glass plate 2 is moved in opposite direction (leftwardly in FIG. 1) for a linear light irradiation to the original during its travel.

During this light irradiation, the takeup shaft 15 is rotated about its axis by the microcomputer 51 for moving the microcapsule sheet 13 toward the takeup shaft 15 at a traveling speed equal to the moving speed of the original support glass plate 2. In this instance, the microcapsule sheet 13 is exposed to light reflected from the original at the exposure stand 7, so that a latent image corresponding to the image of the original is successively formed on the microcapsule sheet 13. When the leading edge portion of the light exposed region of the microcapsule sheet 13 is brought into alignment with the leading edge of the developer sheet 17 because of the rotational motion of the takeup shaft 15, the sheets 13 and 17 are transferred to the pressure developing unit 19. The light exposed region of the microcapsule sheet 13 is pressed against the developer sheet 17, so that a color output image is provided on the developer sheet 17.

In accordance with the rotation of the takeup shaft 15, the microcapsule sheet 13 is separated from the developer sheet 17 by the separation roller 22, and the developer sheet 17 is solely entered into the thermal fixing unit 23. In this case, operation of the cross-flow fan 36 and the heater 34 are controlled by the microcomputer 51 for circulating hot air within the main body 39. Therefore, the colored output image on the developer sheet 17 is fixed, and the developer sheet 17 is then discharged onto the discharge tray 24.

In the thermal fixing operation, the rotation of the gas venting fan 43 is started by the microcomputer 51 at a proper timing prior to the entry of the developer sheet 17 into the thermal fixing unit 23. However, the rotation of the gas venting fan 43 is stopped by the microcomputer 51 when the latter acknowledges the complete discharge of the developer sheet 17 from sheet outlet 38, which acknowledgement is made in accordance with the output signal sent from the sheet passing detection switch (not shown) provided in the guide plate 31 to the microcomputer 51.

During rotation of the gas venting fan 43, the air within the main body 39 is introduced into the filter member 45 through the inlet 37, the outlet 38, the air passage 40 and the duct 44, and is discharged to the atmosphere through the discharge port (not shown) in the supporting frame 42. Therefore, odor and any components released from the developer sheet 17 upon heating are trapped by the filter 45, and purified air is discharged outside through the discharge port.

On the other hand, if the mode is shifted from the high temperature mode to the low temperature mode such as from high gloss mode to low gloss mode, or from OHP mode to high gloss mode, or from OHP mode to the low gloss mode by the manipulation of the mode selection switch 54, the heater 34 is turned OFF by the microcomputer 51 by a predetermined time interval, and at the same time, the gas venting fan 43 is turned ON by the microcomputer 51. Therefore, heat accumulated within the main body 39 can be released by the rotation of the gas venting fan 43, and accordingly, the time period for obtaining the selected decreased temperature mode is reduced.

Reversely, if the mode is shifted from the low temperature mode to the high temperature mode, the heater 34 is turned ON and the gas venting fan 43 is turned OFF by a predetermined time period in the mode switching operation. Therefore, heat escape from the main body 39 can be prevented, thereby reducing the time period for obtaining the selected increased temperature mode.

As described above, in the first embodiment of this invention, odors etc. released from the heated developer sheet can be trapped by the filter 45, and the operation of the gas venting fan 43 is controlled in accordance with the start-up period of the thermal fixing unit and with the mode changing phase, to thus reduce time period for obtaining the desired temperature within the main body 39. Consequently, prompt and smooth start-up operation and mode changing operation result. Particularly, in case of the start-up period and the mode changing timing for changing the low temperature mode to the high temperature mode, excessive power consumption is avoided because of the inoperative state of the gas venting fan.

The filter 45 according to the first embodiment is positioned within the machine frame 1. However, a corresponding filter can be disposed outside the machine frame 1, and instead, the gas venting fan 43 solely disposed within the machine frame. Further, in the first embodiment, three kinds of temperature modes are provided. However, the number of modes can be increased or decreased, and the embodiment shown in FIG. 2 is also available for a monochromatic copying machine.

In summary, according to the first embodiment of this invention, there is provided the gas purification means including the filter member, and therefore, odors etc. released from the heated developer sheet can be trapped by the purification means, to thereby provide a comfortable working condition for the workers.

Further, in the first embodiment of this invention, the gas sucking operation is suspended at the initial start-up period of the thermal fixing unit, to thereby rapidly provide the elevated temperature within the main body capable of providing the thermally fixable condition while eliminating excessive power consumption. Furthermore, in the first embodiment, the gas purification means is efficiently utilized for promptly providing a variety of operation modes having temperatures within the thermal fixing unit different from one another depending upon the kinds of developer sheets used.

Figure 5:
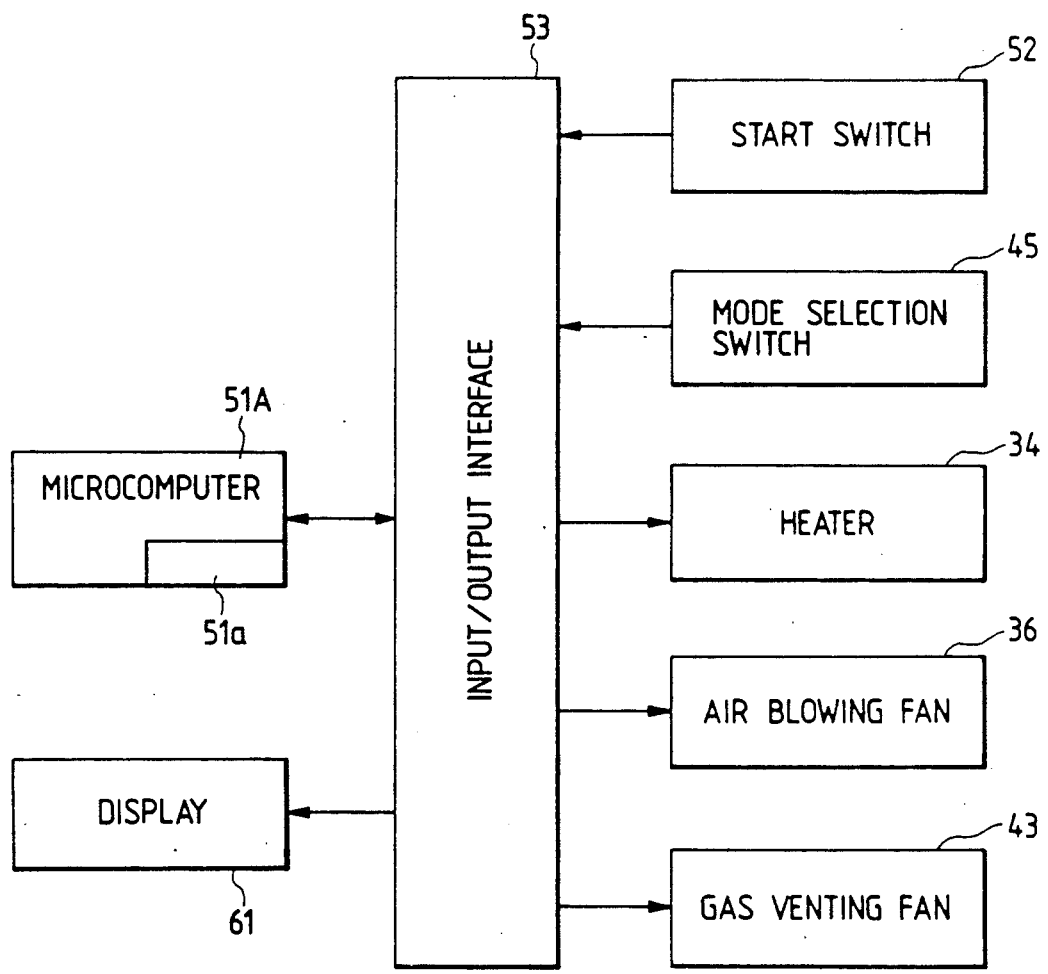
FIG. 5 is a block diagram showing a controlling portion in a second embodiment.

A second embodiment according to the present invention will next be described with reference to FIG. 5. The second embodiment employs a microcomputer 51A provided with a non-volatile memory 51a. Further, a display 61 is connected to an input/output interface 53. Remaining circuitry connection would be the same as those of the first embodiment shown in FIG. 4. The non-volatile memory 51a and the display 61 serve as means for detecting service life of the filter, and means for displaying an unavailable state of the filter.

The non-volatile memory 51a has a storage location in which total copying numbers are stored. Further, the display 61 will notify the operator of the need for replacement of the filter element 45 when the filter is unavailable for trapping the odor and any components therein. More specifically, when the start switch 52 is operated, the microcomputer 51A checks the copying numbers stored in the non-volatile memory 51a. If the copying numbers exceed the predetermined numbers, the microcomputer 51A sends a signal to the display 61 for notifying the operator of the necessity of changing the filter with a new one. At the same time, the microcomputer 51A is rendered in standby state. In the standby state, the copying machine will not be operated even by the operation of the start switch 52. When the display 61 indicates the need for a filter change, the operator must exchange the filter with the new one. Upon completion of the filter replacement, the total copying numbers stored in the non-volatile memory 51a is cleared.

If the total copying numbers do not exceed the predetermined numbers, or if the start switch 52 is again operated after the filter replacement, the operations the same as that of the first embodiment will be carried out.

In the second embodiment, instead of the computation of the total copying numbers for the detection of the service life of the filter, gas detecting means can be used for detecting the specific component of the gas. That is, if the filter 43 is no longer capable of trapping specific component, the density of the component within the gas becomes increased. Therefore, the amount of the components at the downstream side of the filter is measured and compared to that at the upstream side thereof for finally detecting the service life of the filter.

As described above, in the second embodiment, the operator is notified of the need for replacement of the filter, and the copying machine becomes inoperable, when the filter 45 becomes unavailable for trapping the odors, etc. Therefore, disadvantages discharge of the odors, etc. from the copying machine can be obviated, and at the same time, the gas purification means can always be operated within the available conditions of the filter. The second embodiment is particularly useful when installing the copying machine on an office in which inexperienced persons may use the copying machine who cannot recognize optimum filter exchanging timing unless means are provided for detecting the service life of the filter and means are provided for displaying the unavailability of the filter.

Figure 6:
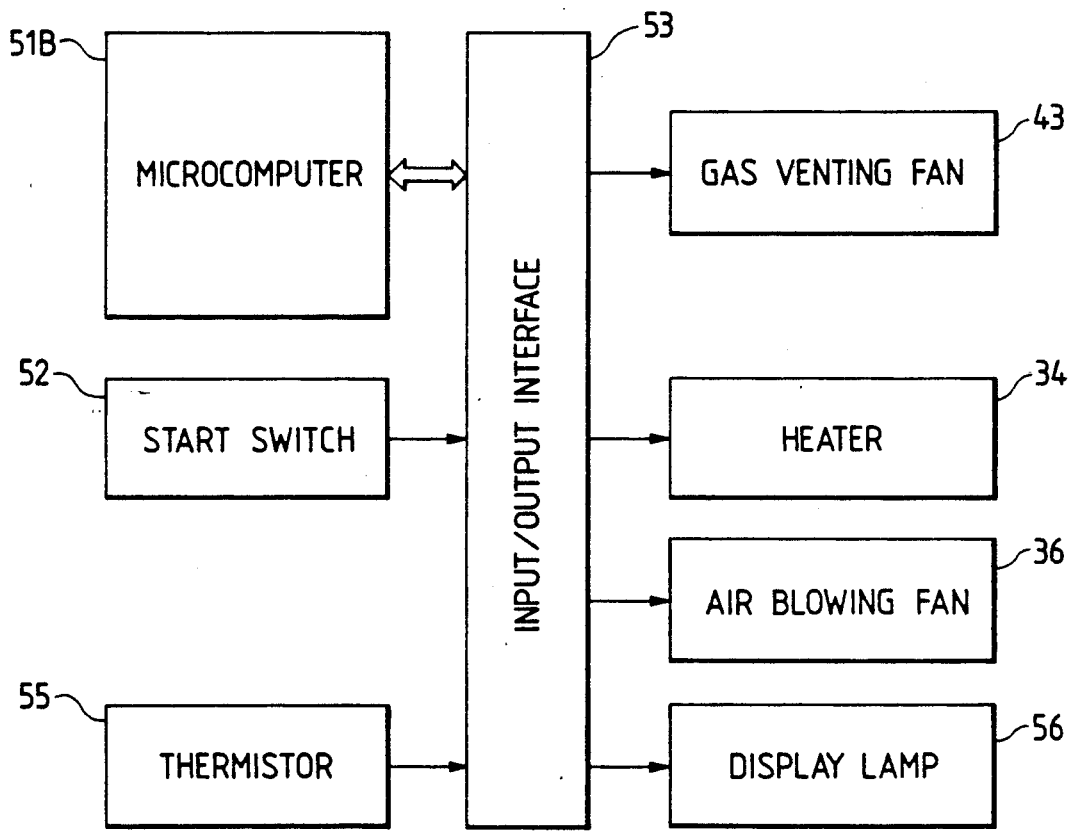
FIG. 6 is a block diagram showing a controlling portion in a third embodiment.

A third embodiment according to the present invention will next be described with reference to FIGS. 6 thru 8. In the third embodiment, a microcomputer 51B is so arranged to provide means for computing a temperature elevation rate, means for determining the rate, and alarming means. The means for computing a temperature elevation rate and the determining means serve as means for determining existence of the filter 45. That is, similar to the foregoing embodiments, a thermistor 55 is provided within the main body 39 so as to generate a detection signal indicative of the temperature within the main body 39. The signal from the thermistor 55 is supplied to the microcomputer 51B in order to determine the temperature elevation ratio. As shown in FIG. 8, if the filter 45 is assembled in the gas purification means, the temperature within the main body 39 can be rapidly increased as shown in a solid line A, so that desirable elevated temperature such as 130° C. in the low gloss mode can be promptly obtained, even though the filter allows a restricted amount of air to pass therethrough. However, if no filter is assembled, the temperature within the main body 39 cannot be promptly increased as shown in dash-dot line B due to the free air leakage through the discharge port. If the temperature increasing ratio is lower than a predetermined ratio stored in the microcomputer 51B, the determination means determines that no filter is provided, and the result of the determination is displayed by the alarming means.

Figure 7:
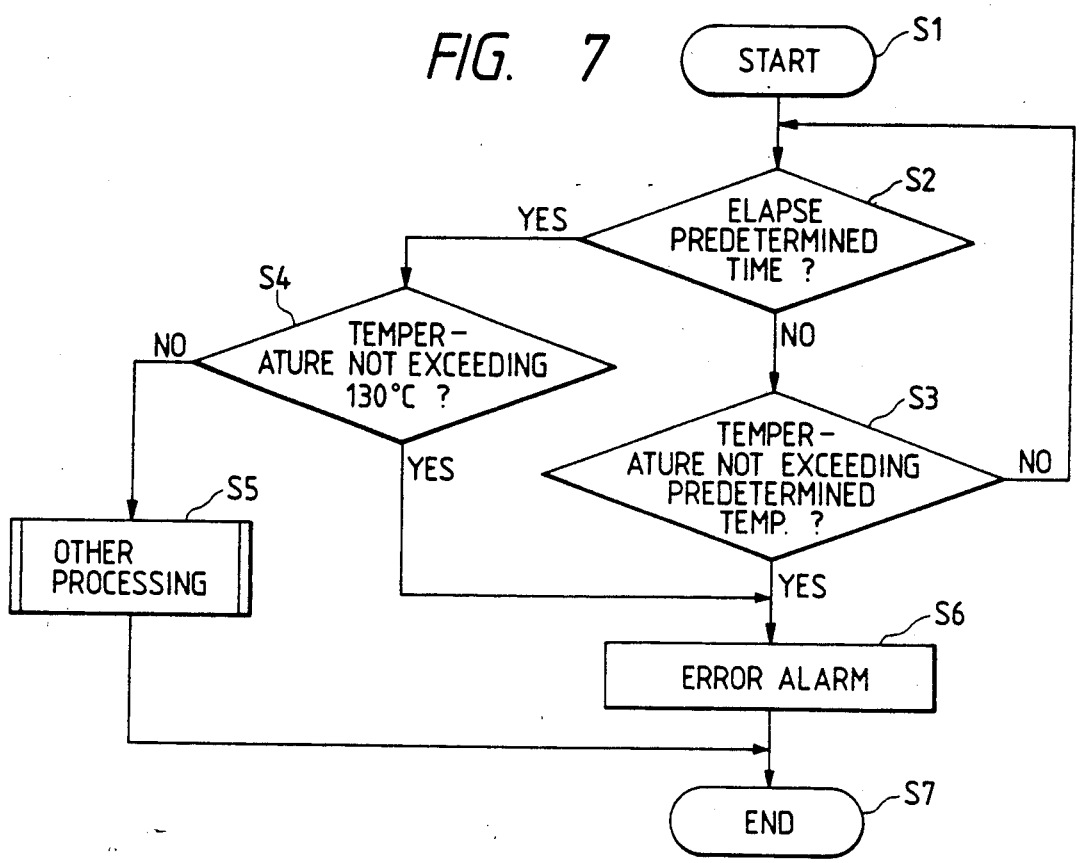
FIG. 7 is a flow chart for description of the operation in the third embodiment.
Figure 8:
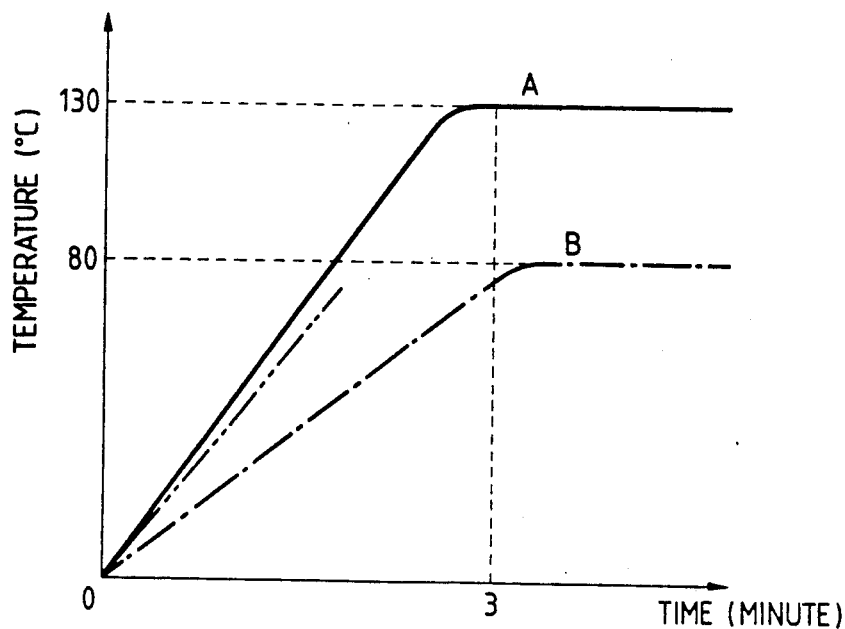
FIG. 8 is a graph showing the relationships between a temperature increase and time when employing a filter element and without employment of the filter.

Operational sequence in the third embodiment is shown in FIG. 7. For color copying, in step S1, upon depression of a power switch (not shown), the heater 34 and the fan 36 are operated so as to elevate a temperature within the main body 39. Further, the gas venting fan 43 is also operated to start gas ventilation. In step S2, determination is made whether or not a predetermined time period, for example 3 minutes, has passed. If YES, a routine proceeds into step S4 where determination is made as to whether or not the temperature has reached a predetermined temperature such as 130° C. If the temperature exceeds this temperature, the routine proceeds to step S5 where an ordinary processing is carried out and the routine is terminated at step S7.

In step S4, if the temperature does not reach the predetermined temperature, the routine returns to step S6 where an error signal is generated with lighting a display lamp 56. Therefore, an operator can identify any abnormality in the copying machine and the necessity for effecting maintenance thereto. Then, the routine proceeds into step S7 where the operations of the heater 34, the fan 36 and the gas venting fan 43 are stopped.

In step S2, if the predetermined time period has not been passed the routine returns to step S3 where determination is made as to whether or not the temperature elevation ratio is less than the predetermined ratio. That is, this determination can be effected on a basis of the inclination angles shown in FIG. 8. If NO (the ratio is not less than the predetermined ratio), the routine returns to the step S2. On the other hand, if YES (the rate is less than the predetermined ratio), the routine proceeds into the step S6 for alarming and into S7 so as to stop operations of the heater 34, the fan 36 and the gas venting fan 43. Therefore, an operator is notified that no filter 43 is assembled in the gas purification means.

After assembly of the filter 43, the start switch 52 is operated so that the color copying operation such as exposure, pressure developing and thermal fixing operations are successively performed in a manner similar to those described in the foregoing embodiments.

As described above, according to the third embodiment of this invention, the temperature in the thermal fixing unit 23 at a position upstream of the deodorization filter 45 is detected by the thermistor 55, and existence of the filter 45 can be determined by the temperature elevation rate computed by the signal from the thermistor 55. If the filter 45 is not assembled, the operations of the heater 34, the hot air circulating fan 36 and the gas venting fan 43 can be stopped, to thereby minimize power consumption. Further, if the deodorization filter 45 is not provided, the display lamp 56 is lighted, so that an operator can recognize this fact. Therefore, a new filter can surely be placed into the gas purification means after removal of the old filter.

Furthermore, in this embodiment, the thermistor 55, which mainly serves to control the temperature within the thermal fixing unit 23 during the color copying operation, is used for the purpose of detecting the existence of the deodorization filter 45. Accordingly, another particular detection device such as a temperature sensor or a limit switch can be dispensed with for detecting the existence of the filter 45. Consequently, production costs can be lowered.

Moreover, in the third embodiment, the operations of the heater 34, the hot air circulating fan 36 and the gas venting fan 43 can be stopped, and the display lamp 56 lighted for displaying any malfunction, if the temperature within the thermal fixing unit 23 does not reach the predetermined temperature such as 130° C. after time elapsing counting from the power supply. Therefore, excessive power consumption can be reduced, and operator can identify the necessity of effecting maintenance to the thermal fixing unit and the gas purification means.

The third embodiment is also available for a monochromatic printer. Further, in the third embodiment, an additional thermistor can be installed in the duct 44 in addition to the thermistor 55 within the thermal fixing unit for detecting the temperature within the duct 44. In this case the temperature elevation rate in the duct 44 can be computed in the microcomputer 51B so as to recognize the existence of the filter 45. Further, instead of the display lamp 56, an alarm buzzer can be used. Alternatively, the display lamp 56 can be dispensed with.

While the invention has been described in detail and with reference to specific embodiment thereof, it would be apparent to those skilled in the art that various changes and modifications can be made therein without departing from the spirit and scope of the invention.

What is claimed is:

1. A thermal fixing unit for thermal fixing an output image recorded on an image recording medium, the image recording medium including a developer sheet comprising a base substrate and a developer material coated thereover, the output image being formed by a chromogenic reaction between the developer material and a chromogenic material selectively formed on a separate photosensitive sheet, the thermal fixing unit comprising:
    a main frame provided with a sheet inlet and a sheet outlet and defining a sheet path therebetween;
    a transferring means disposed within the main frame for transferring the developer sheet along the sheet path;
    a heating means disposed within the main frame for heating the developer sheet transferred along the sheet path, the developer sheet releasing gaseous component upon heating, the heating means having a plurality of operational modes and further comprising a heater for heating air within the main frame and a hot air circulating fan for circulating the hot air provided by the heater, the hot air being applied to the developer sheet; and
    gas purification means connected to the main frame for removing the gaseous component, said gas purification means being hermetically connected to the main frame.

2. The thermal fixing unit as claimed in claim 1, wherein the gas purification means comprising;
    a duct body disposed to surround the main frame,
    a support body having one end connected to the duct body, a fluid passage being defined between the main frame and the duct body, and the fluid passage being connected between the one end of the support body and the sheet inlet and sheet outlet;
    a gas venting fan rotatably provided at the support body for sucking fluid in the main frame through the sheet inlet, the sheet outlet and the fluid passage; and
    a filter member disposed in the support body for trapping the gaseous component released from the developer sheet.

3. The thermal fixing unit as claimed in claim 2 further comprises means for setting one temperature mode among a plurality of temperature modes within the main frame for providing heating temperature different from one another depending upon kinds of the developer sheet, and wherein the gas purification means further comprises control means for controlling the operational modes of the heater, the hot air circulation fan and the gas venting fan.

4. The thermal fixing unit as claimed in claim 3, wherein the plurality of temperature modes comprise a low temperature mode, an intermediate temperature mode and high temperature mode, and wherein the control means comprises a microcomputer and a thermistor connected thereto for stopping operation of the gas venting fan when the temperature mode is shifted from low temperature mode to the intermediate mode or from the intermediate mode to the high temperature mode, or from the low temperature mode to the high temperature mode, and for stopping operations of the heater and the hot air circulation fan when the temperature mode is shifted from the high temperature mode to the low temperature mode, or from the high temperature mode to the intermediate temperature mode, or from the intermediate temperature mode to the low temperature mode.

5. The thermal fixing unit as claimed in claim 4, wherein the thermistor is disposed within the main frame.

6. The thermal fixing unit as claimed in claim 2, wherein the gas purification means further comprises means for detecting service life of the filter, and means for displaying unavailable state of the filter.

7. The thermal fixing unit as claimed in claim 6, wherein the means for detecting the service life of the filter comprises an incrementing means for counting numbers of the developer sheets passing through the main frame.

8. The thermal fixing unit as claimed in claim 6, wherein the means for detecting the service life of the filter comprises a gas density detector.

9. The thermal fixing unit as claimed in claim 7, wherein the gas purification means further comprises;
   means for detecting a fluid temperature, the temperature detection means being positioned at a position upstream of the filter, and providing a signal indicative of the temperature;
   means for computing a temperature elevation rate within the main frame, the computing means being operated in response to the signal sent from the temperature detecting means;
   means for determining existence of the filter as a result of the computation, the determination means determination non existence of the filter when the computed rate is lower than a predetermined rate; and
   alarming means for alarming non-existence of the filter as a result of the determination in the determining means.

10. The thermal fixing unit as claimed in claim 9, wherein the alarming means comprises a display lamp.

11. The thermal fixing unit as claimed in claim 9, wherein the alarming means comprises a buzzer.

12. The thermal fixing unit as claimed in claim 1 further comprising means for setting one temperature mode among a plurality of temperature modes within the main frame for providing a heating temperature different from one another depending upon kinds of the developer sheet, wherein the gas purification means further comprises control means for controlling the operational modes of the heater, the hot air circulation fan and the gas venting fan.

13. The thermal fixing unit as claimed in claim 12, wherein the plurality of temperature modes comprises a low temperature mode, an intermediate temperature mode and high temperature mode, and wherein the control means comprises a microcomputer and a thermistor connected thereto for stopping operation of the gas venting fan when the temperature mode is shifted from the low temperature mode to the intermediate mode or from the intermediate mode to the high temperature mode, or from the low temperature mode to the high temperature mode, and for stopping operations of the heater and the hot air circulation fan when the temperature mode is shifted from the high temperature mode to the low temperature mode, or from the high temperature mode to the intermediate temperature mode, or from the intermediate temperature mode to the low temperature mode.

14. A thermal fixing unit for thermally fixing an output image recorded on an image recording medium, the image recording medium including a developer sheet comprising a base substrate and a developer material coated thereover, the output image being formed by a chromogenic reaction between the developer material and a chromogenic material selectively formed on a separate photosensitive sheet, the thermal fixing unit comprising:
   a main frame provided with a sheet inlet and sheet outlet and defining a sheet path therebetween;
   a transferring means disposed within the main frame for transferring the developer sheet along the sheet path;
   a heating means disposed within the main frame for heating the developer sheet transferred along the sheet path, the developer sheet releasing a gaseous component upon heating, the heating means providing a plurality of operational modes;
   gas purification means connected to the main frame for removing the gaseous component, the gas purification means having control means for controlling the operational modes of the heating means; and
   means for setting one temperature mode among a plurality of temperature modes within the main frame for providing heating temperature different from one another depending upon kinds of the developer sheet.

15. The thermal fixing unit as claimed in claim 1, further comprising two heat insulation rollers for preventing heated and circulated air from leaking from the main frame, one of the heat insulation rollers being positioned immediately downstream of the sheet inlet of the main frame and the other heat insulation roller being positioned immediately upstream of the sheet outlet of the main frame.

* * * * *